(12) United States Patent
Costard et al.

(10) Patent No.: US 6,534,758 B2
(45) Date of Patent: Mar. 18, 2003

(54) ELECTROMAGNETIC WAVE DETECTOR USING QUANTUM WELLS AND SUBTRACTIVE DETECTORS

(75) Inventors: Eric Costard, Massy (FR); Philippe Bois, Cesson (FR); Marcel-Francis Audier, Paris (FR)

(73) Assignee: Thales, Paris (FR)

( * ) Notice: Subject to any disclaimer, the term of this patent is extended or adjusted under 35 U.S.C. 154(b) by 70 days.

(21) Appl. No.: 09/900,873

(22) Filed: Jul. 10, 2001

(65) Prior Publication Data
US 2002/0040960 A1 Apr. 11, 2002

(30) Foreign Application Priority Data
Jul. 11, 2000 (FR) .......................................... 00 09052

(51) Int. Cl.⁷ .............................................. H01L 27/00
(52) U.S. Cl. ...................................... 250/208.1; 257/14
(58) Field of Search .......................... 250/208.1, 214.1, 250/226; 257/14, 440, 17, 184, 189, 21, 432; 356/402, 403

(56) References Cited
U.S. PATENT DOCUMENTS

| 5,086,327 A | 2/1992 | Rosencher et al. |
| 5,187,715 A | 2/1993 | Weisbuch et al. |
| 5,228,777 A | 7/1993 | Rosencher et al. |
| 5,326,984 A | 7/1994 | Rosencher et al. |
| 5,506,418 A | 4/1996 | Bois et al. |
| 5,677,544 A | 10/1997 | Duboz et al. |
| 5,712,499 A | 1/1998 | Duboz et al. |
| 5,719,670 A | 2/1998 | Duboz et al. |
| 5,726,500 A | 3/1998 | Duboz et al. |
| 5,812,190 A | 9/1998 | Audier et al. |
| 5,869,844 A | 2/1999 | Rosencher et al. |
| 5,998,777 A | 12/1999 | Aurdier et al. |
| 6,091,126 A | 7/2000 | Costard et al. |
| 6,157,020 A | 12/2000 | Krapf et al. |
| 6,184,538 B1 * | 2/2001 | Bandara et al. ................. 257/21 |
| 6,414,298 B1 * | 7/2002 | Nakajima ................ 250/214 R |

FOREIGN PATENT DOCUMENTS

| EP | 0 664 554 | 7/1995 |
| EP | 0 849 798 | 6/1998 |
| FR | 26 16 992 | 12/1988 |
| FR | 27 61 813 | 10/1998 |

* cited by examiner

*Primary Examiner*—Stephone B Allen
*Assistant Examiner*—Bradford Hill
(74) *Attorney, Agent, or Firm*—Oblon, Spivak, McClelland, Maier & Neustadt, P.C.

(57) ABSTRACT

The basic idea is as follows: operational simulations of subtractive focal planes, based on the French patent No. 2 756 666, have shown that the optimal subtraction rate should not be total in order to preserve the dynamic range of the system. In this case, the low-frequency fluctuations of the temperature of the focal plane of the bias voltages will be amplified and will give rise to a fluctuation of the mean gray level of the signal at output of the multiplexer. This variation can be corrected simply by:

- the making of several columns of subtractive pixels without diffraction grating, for which the integrated signal is directly the residual level of the thermal current;
- the integration of a comparator circuit at input of the electronic card to subtract the signal generated in the reference pixels from the signals integrated into the active pixels.

4 Claims, 5 Drawing Sheets

ELECTROMAGNETIC WAVE DETECTOR USING QUANTUM WELLS AND SUBTRACTIVE DETECTORS

BACKGROUND OF THE INVENTION

1. Field of the Invention

The invention relates to a self-compensation device for subtractive detectors.

The aim of the invention is to improve thermal imaging systems using subtractive architecture to eliminate the continuous component of the integrated current. The principle of a subtractive detector is described in the French patent No 2 756 666 and is recalled in FIGS. 1a and 1b.

2. Description of the Prior Art

As can be seen in a simplified view in FIG. 1a, a detector according to the French patent No 2 756 666 comprises the following elements stacked on a substrate:

a contact layer C2,
an active photoconductive layer D2,
a common contact layer Cc
an active photoconductive layer D1,
and a contact layer C1.

The active photoconductive layers D1, D2 may be layers made of a photoconductive semiconductor material such as silicon. They may also be made in the form of stacks of layers constituting quantum well detectors. The two active layers D1, D2 are photoconductive in the same range of wavelengths $\lambda$. One of the active layers is designed to be highly absorbent in the range of wavelengths $\lambda$ while the other layer is designed to absorb very little or be practically non-absorbent. This can be designed by having different thicknesses for the active layers, or by a greater doping of the quantum well layers of the more absorbent active layer. It is possible for the contact layers C1, C2, Cc not to cover the entire surface of the photoconductive layers.

Since the detector is illuminated by the radiation to be detected as can be seen in FIG. 1a, the active layer D2 first receives the radiation RZ.

Should the layer D1 be more absorbent than the layer D2, a diffraction grating is preferably provided. The diffraction grating is associated with the face of the layer D1 bearing the contact layer C1. This grating receives the light that had not been absorbed during the first crossing of the layer D1 and diffracts it towards the layer D1. The diffracted light will be absorbed or almost absorbed by the layer D1.

The contact layers C1 and C2 are used to apply control potentials. The contact layer Cc is common with the two detector elements comprising the active photoconductive layers.

It is set at a reference potential and enables the detection of the photo currents generated by the detector D1, D2.

The substrate is transparent to the range of wavelengths to be measured. The detector therefore receives the radiation RZ through the substrate.

When a radiation RZ is received by the detector, to detect the wavelength (or range of wavelengths) $\lambda$, the following are applied:

a potential V1 to the contact layer C1,
a potential V2 to the contact layer C2:
a floating potential Vc (or ground), between V1 and V2, to the common contact layer Cc.

In the structure D1, the following current flows:

$$I1=I1d+I1opt$$

And in the structure D2, the following current flows $$I2=I2d+I2opt$$

The currents I1d and I2d are the dark currents in D1 and D2. The currents I1d and I2d may also represent the sum of a dark current and a current corresponding to the surroundings. The currents I1opt and I2opt are the currents due to the wavelength $\lambda$ to be detected in D1 and D2.

In FIG. 1b, the current i collected by the read circuit has the following value:

$$I=I1-I2$$

By adjusting the voltage V1 or V2, it is possible to adjust I1d=I2d. The value of the detected current is therefore:

$$I=I1opt-I2opt$$

By planning the structure so that one of the two active layers absorbs very little energy from the wave $\lambda$, the current I is the one generated by the active layer that has the strongest response.

The total current of a thermal imaging device is the sum of (a) an offset current, constituted by a dark current thermally activated according to a law of the Arrhenius type, $I=I_0 \exp(-hc/\lambda)kT)$, and (b) the current of the optical signal generated by the variations in emissivity and temperature of the scene. The architecture of a subtractive focal plane is used to subtract the continuous component before integration and therefore make full use of the frame time available to integrate the signal without saturating the individual storage capacity of each pixel. This improves the signal-to-noise ratio of the detectors. The two stages QWIP1 and QWIP2 are identical structures. The stage QWIP1, biased at $-V_s$, is the detection stage and the stage QWIP2, reverse biased at $+V_{ref}$, is the reference mirror stage, enabling the total or partial subtraction of the current. The intermediate contact is connected to the corresponding storage capacitor of the multiplexer and thus enables the collection of the resulting current, namely the difference in the currents flowing through the two stages.

A thermal imaging device comprises a cooling unit (Stirling machine, Joule-Thomson pressure-reducing device, liquid nitrogen bath etc) and a regulation system capable of stabilizing the temperature of the focal plane $T_0$ to within $\pm \Delta T$. The slow fluctuation of the temperature, which has a variation in amplitude of $2\Delta T$, will generate a variation of the thermal current of each of the stages.

The invention can be used to resolve this problem.

SUMMARY OF THE INVENTION

The invention therefore relates to a device for the detection of electromagnetic waves comprising at least two photoconductor-based electromagnetic wave detectors, each comprising:

at least two separate, flat-shaped, stacked photoconductor-based active detector elements, comprising a common reading contact, the unit being held between two control contact layers;

means to apply control voltages to each control contact layer, a voltage applied to the common reading contact layer having a value ranging between the voltages applied to the control contact layers;

means connected to the common contact to detect the difference between the photoconduction currents of the detector elements;

wherein at least one detector is provided, on one of its plane faces, with a diffraction grating and wherein a subtraction circuit is used to subtract the read signal of a detector not provided with a diffraction grating from the read signal of a detector provided with a diffraction grating.

BRIEF DESCRIPTION OF THE DRAWINGS

The various objects and features of the invention will appear more clearly from the following description and from the appended figures, of which.

MORE DETAILED DESCRIPTION

Figure 2:
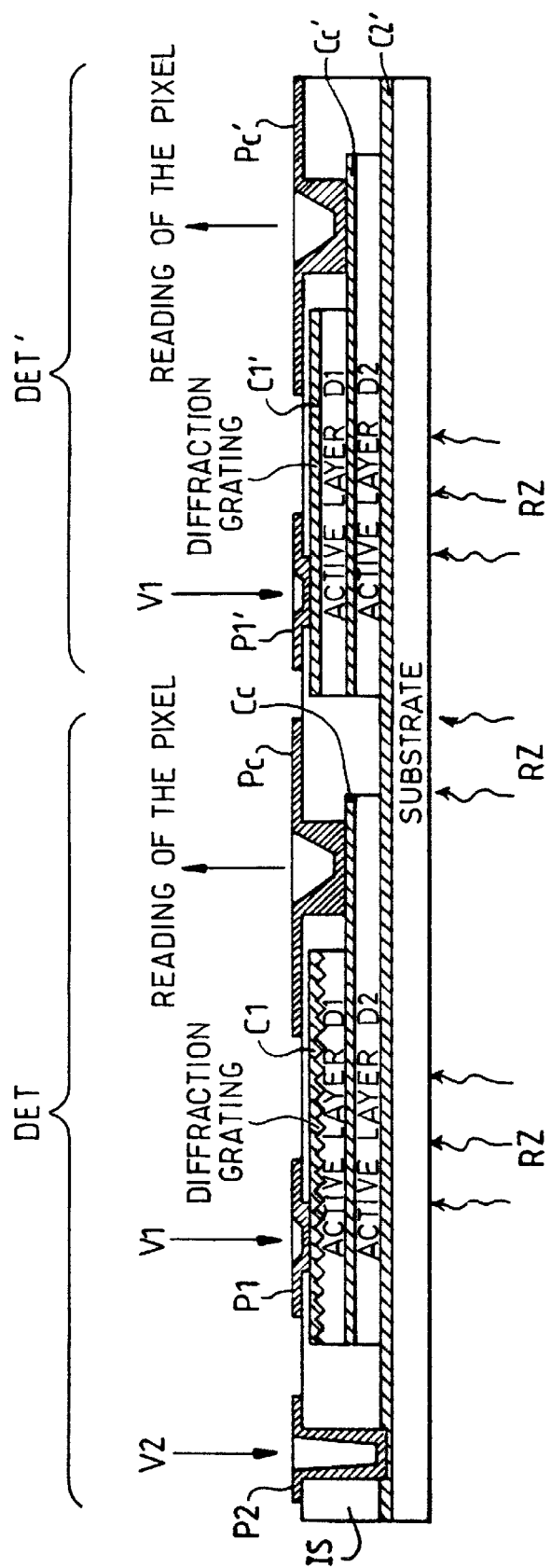
FIG. 2 shows a simplified example of a detection device according to the invention.

FIG. 2 shows a detection device according to the invention. It essentially comprises at least two detectors DET and DET'.

Figure 1A:
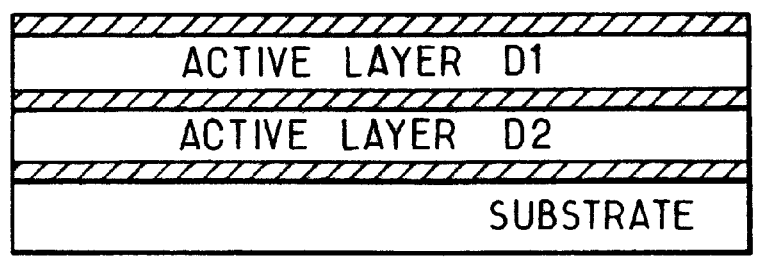
FIGS. 1a and 1b show a prior art subtractive detector.
Figure 1B:
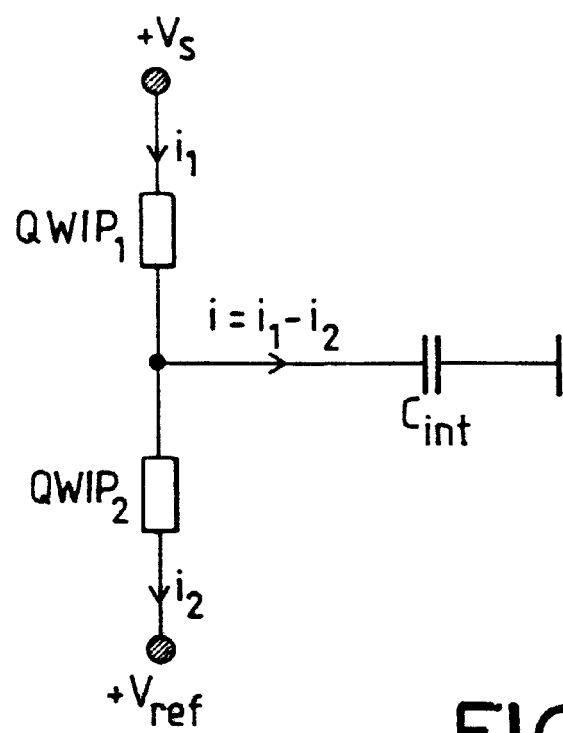

The detector DET is made similarly to the detector of FIG. 1a. It comprises the active photoconductive layers D1, D2 and the contact layers C1, C2, Cc.

Preferably, the detector is encapsulated in an insulating material IS. Contact pins P1, P2, PC are used to make connection with the contact layers and they go through the material IS when this has been planned.

A diffraction grating RZ is provided on the surface of the layer D1.

The detector DET' is similar to the detector DET. It may even be made in layers almost identical to those of the detector DET. It therefore comprises the photoconductive layers D1', D2' and the contact layers C1', C2', and Cc'. On the contrary, the detector DET' does not have any diffraction grating. Thus, the subtraction of the current measurement of the detector DET' from the current measurement of the detector DET will eliminate the variations in currents due to the original thermal variations of the detectors.

An exemplary circuit used to obtain this subtraction shall be described here below in an application to a matrix of detectors.

We shall first of all describe a matrix of detectors according to the invention.

Figure 3A:
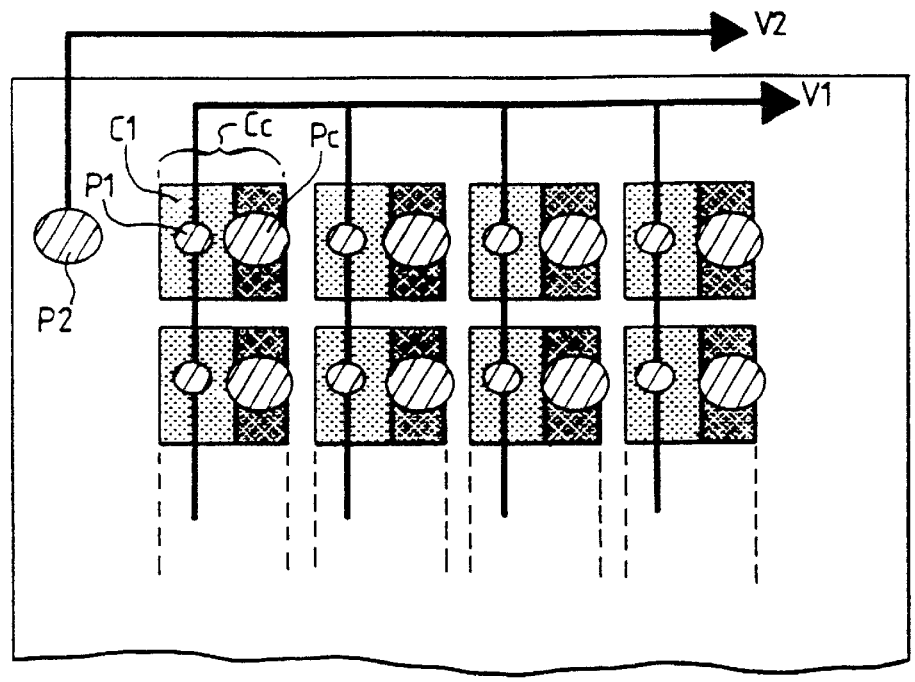
FIGS. 3a and 3b show a detection matrix according to the invention
Figure 3B:
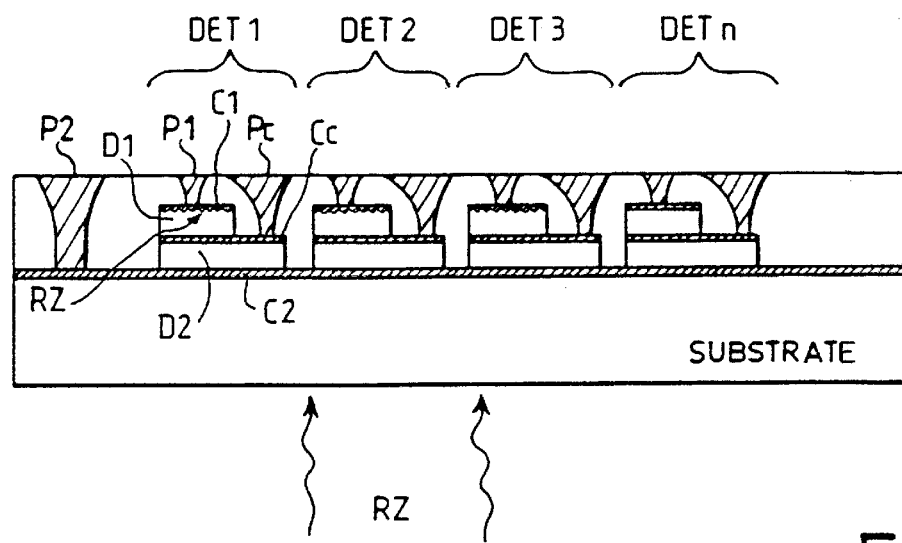

FIGS. 3a and 3b show a top view and a sectional view of a matrix embodiment of a two-spectrum detector according to the invention.

The different detectors are made on a control contact layer C2 common to all the detectors. The connection pad P2 is therefore common to the entire matrix. Each detector of the matrix comprises a detector element D1 and a detector element D2 as well as the contact layers C1 and Cc and the connection pads P1 and Pc. The connection pads P1 are all connected to one another to apply a potential V1 (see above) to all the detector elements D1 of the matrix. Since the contact layer C2 and the connection pad P2 are common to the entire matrix, the potential V2 applied to the pad P2 is applied to all the detector elements D2 of the matrix.

For the reading of the detectors of the matrix, each detector is located at the point of intersection of an array of row conductors and column conductors. Each point of intersection has, for example, transistors Tr whose base is connected to the row wire. The emitter and the collector are respectively connected to a pad Pc and to a column wire. The application of an appropriate potential to a row wire controls all the transistors of the row and connects all the pads Pc of a row to column wires. It is thus possible, on each column wire, to read the photocurrent generated by the detector connected to this column wire.

In this exemplary embodiment, all the layers C1 are mutually interconnected and controlled by one and the same potential. This is also the case for the contact layers C2 which are connected to the pad P2.

However, according to one alternative embodiment, it is planned that the control contact layer C2 will be subdivided into strips so that each strip is common to a row of detectors. There will then be one pad P2 per contact strip C2, namely per row of detectors.

Similarly, instead of being all interconnected, the pads P1 are connected by rows of detectors. There is one pad P1 per row of detectors.

The pads Pc of the detectors are connected by column wires of the matrix.

The working of the matrix of detectors is then achieved sequentially by row.

As can be seen in FIG. 3b, the detectors DET1 to DET3 have a diffraction grating RZ on the surface of their photoconductive layer D1. However, the detector DETn does not have such a diffraction grating.

Figure 4:
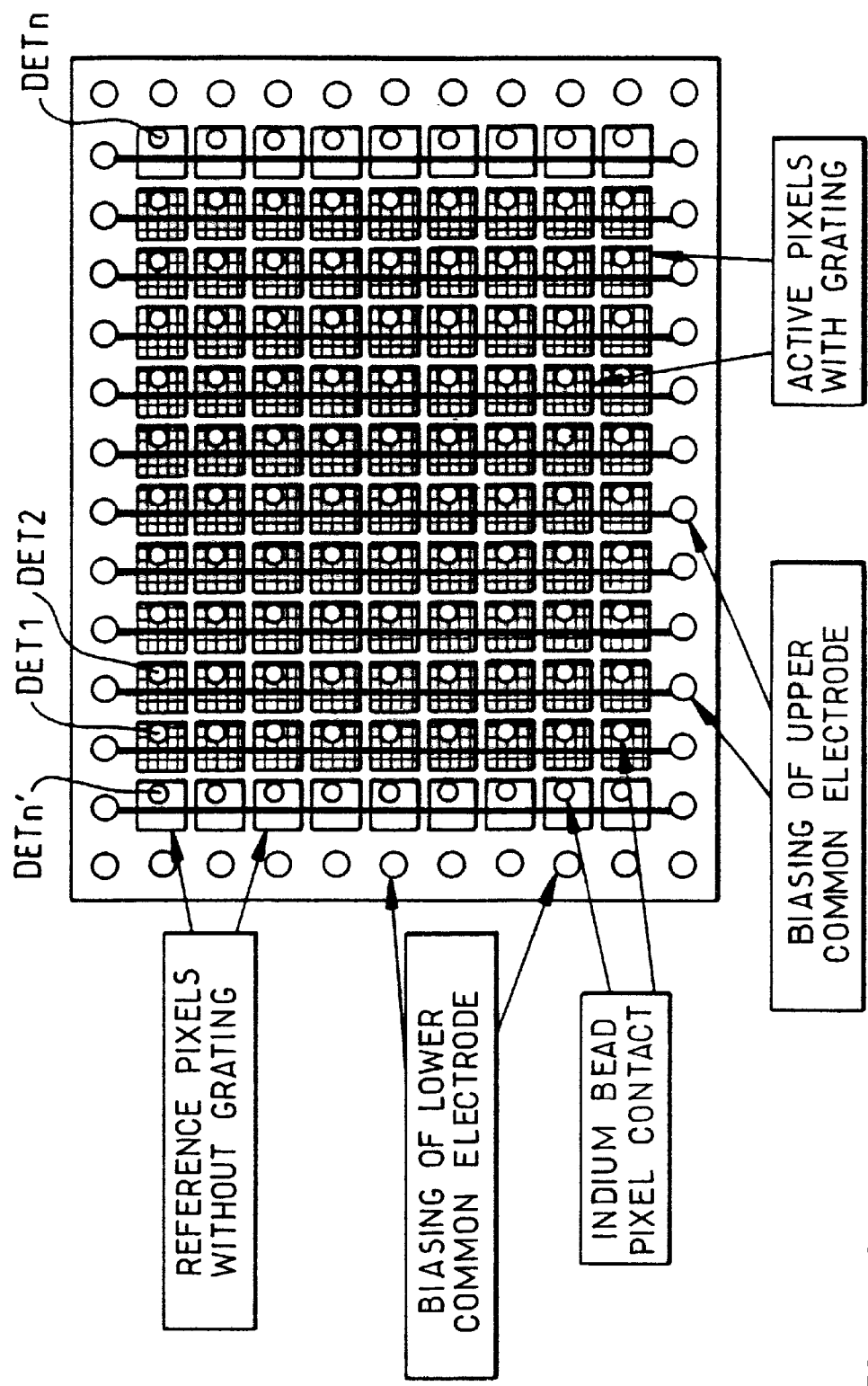
FIG. 4 shows an organization of a matrix according to the invention

FIG. 4 shows another top view of a matrix of detectors thus designed. The first row of the matrix has the detectors DET1, DET2, . . . DETn. A detector DETn' similar to the detector DETn (hence without a diffraction grating) has also been provided to the left. The detectors DETn, DETn' will be used to provide the temperature compensation signal for the detectors of the row.

The other rows of the matrix are designed in the same way.

Figure 5:
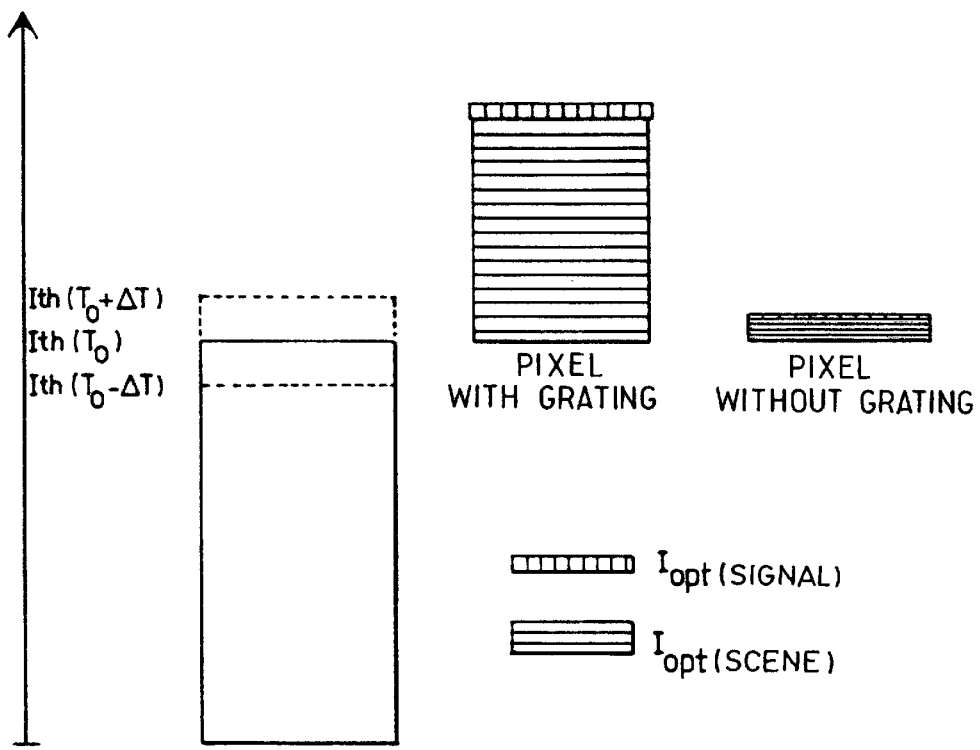
FIG. 5 shows the distribution of the different contributions to the total current.

In a nominal mode of operation, the subtraction rate γ should be lower than 100% in order to keep a reserve dynamic range for the system (see FIG. 5). Under these conditions, there will therefore remain a part of the original thermal current in the integrated current and the signal stored in the integration capacitor will vary slowly according to the temperature fluctuations. The undesirable effect will be a drift in offset of the output signal of the focal plane and therefore a slow fluctuation in the mean gray level of the image.

Figure 6:
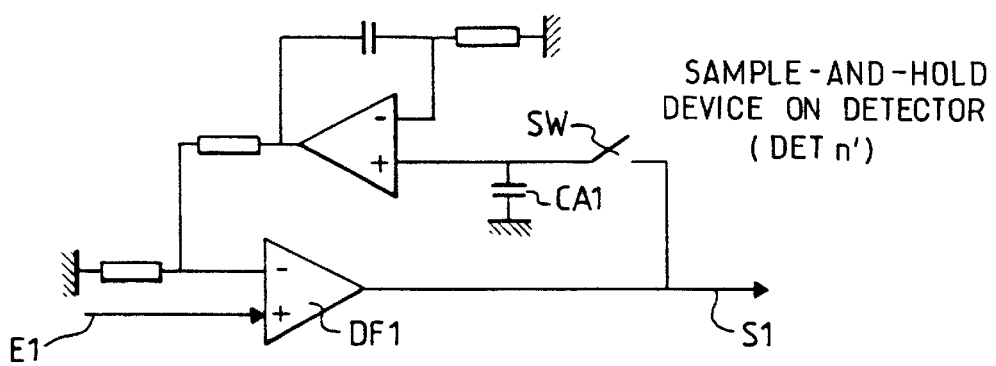
FIG. 6 shows an electronic circuit to subtract the reading of a detector used to measure the thermal current from the reading of a detector of a matrix.

The principle of the invention lies in providing the processing electronic circuitry of the camera with information about the residual level of the original thermal current in the integrated circuits, in the conditions of subtraction rate and operating temperature of each video frame. The electronic card of the camera will have a comparator circuit to adjust the level of offset (FIG. 6).

The principle of the subtractive detector is based on the fact that the diffraction grating made on the upper electrode of the pixel firstly amplifies the response and secondly differentiates the optical response between the two stages $(R_1/R_2=\beta)$. Without grating, the two stages of the subtracting pixel have the same of low value of optical response $R_0/R_1/\eta_{res}$. Thus, for a subtraction rate γ, the signal integrated on pixels provided with grating will be:

$$I_{res} = (1-\gamma)I_{th}(T) + R_1 P_{opt}\left(1-\frac{\gamma}{\beta}\right)$$

and for pixels without grating it will be:

$$I_{ss\ res}=(1-\gamma)I_{th}(T)+R_0P_{opt}(1-\gamma)$$

In the case of operation at a temperature where the thermally generated current is preponderant ("high temperature" operation for which $R_1P_{opt}>I_{th}(T)$), the signal integrated on pixels without grating is approximately reduced to the thermal component of the integrated current, namely $(1-\gamma)I_{th}(T)$.

For example, a numerical application gives the following values:

$\gamma=0.9$, $\beta=5$, $\eta_{res}=10$: $I_{res}^{opt}=0.82$. $R_1P_{opt}$ may be comparable to $(1-\gamma)\ I_{th}(T)$ while $I_{ss\ res}^{opt}=0.01$. $R_1\ P_{opt}<<(1-\gamma)I_{th}(T)$ The circuit of FIG. 6 is used to read a detector such as DETn' and record the reading in a capacitor CA1. For this reading, the input E1 is connected to the read pad (Pc) of DETn'. Then, the input E1 is connected, by means not shown, successively to the read pads Pc of the different detectors DET1, DET2, etc. of a row. At each reading of a detector, such as DET1, a current corresponding to the read current of the detector DETn', whose reading has been recorded in the capacitor CA1, is subtracted from the read current of the detector DET1 read. This subtraction is done by the differential circuit DF1. The output S1 thus gives the read current. In this read current, the current due to the thermal noise has been reduced. The measurements are thus continued in this way for the different detectors of a row, and then for the following rows of detectors.

Finally, to be complete, the electronic system could compare the thermal reference signal of the column 0 and n+1 of the frame i with the reference signals of the frame i–1 in order to eliminate the risk of an undue correction caused by the appearance of a hot point on the periphery of the field of vision of the imaging device and detected by the very low (but not zero) residual level of the optical response on these reference pixels.

What is claimed is:

1. A device for the detection of electromagnetic waves comprising at least two photoconductor-based electromagnetic wave detectors, each comprising:
   at least two separate, flat-shaped, stacked photoconductor-based active detector elements, comprising a common reading contact, the unit being held between two control contact layers;
   means to apply control voltages to each control contact layer, a voltage applied to the common reading contact layer having a value between the voltages applied to the control contact layers;
   means connected to the common contact to detect the difference between the photoconduction currents of the detector elements;
   wherein at least one detector is provided, on one of its plane faces, with a diffraction grating and wherein a subtraction circuit is used to subtract the read signal of a detector not provided with a diffraction grating from the read signal of a detector provided with a diffraction grating.

2. A detection device according to claim 1, comprising a matrix of detectors arranged in rows and columns, each row comprising at least one additional detector without diffraction grating.

3. A device according to claim 2, comprising at least one subtraction circuit per row of detectors, said circuit recording first of all the reading of the additional detector and then subtracting the reading of this additional detector from the reading of each detector of this line.

4. A device according to claim 3, comprising a memory circuit such as a capacitor storing the reading of the additional detector, as well as a differentiator that can be connected successively to the common contacts of the different detectors of the row and, at each connection to a detector, subtracting, from the current read by this detector, a current corresponding to the stored reading of the additional detector.

* * * * *

UNITED STATES PATENT AND TRADEMARK OFFICE
CERTIFICATE OF CORRECTION

PATENT NO. : 6,534,758 B2
DATED : March 18, 2003
INVENTOR(S) : Costard et al.

It is certified that error appears in the above-identified patent and that said Letters Patent is hereby corrected as shown below:

<u>Title page, Item [54] and Column 1, lines 1-3,</u>
Should read:
-- [54]  SELF-COMPENSATION DEVICE FOR SUBTRACTIVE DETECTORS --

Signed and Sealed this

Seventh Day of October, 2003

JAMES E. ROGAN
*Director of the United States Patent and Trademark Office*